(12) United States Patent
Ness et al.

(10) Patent No.: US 6,744,060 B2
(45) Date of Patent: Jun. 1, 2004

(54) PULSE POWER SYSTEM FOR EXTREME ULTRAVIOLET AND X-RAY SOURCES

(75) Inventors: Richard M. Ness, San Diego, CA (US); Igor V. Fomenkov, San Diego, CA (US); William N. Partlo, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 64 days.

(21) Appl. No.: 10/120,655

(22) Filed: Apr. 10, 2002

(65) Prior Publication Data

US 2002/0163313 A1 Nov. 7, 2002

Related U.S. Application Data

(63) Continuation-in-part of application No. 09/690,084, filed on Oct. 16, 2000, now Pat. No. 6,566,667, which is a continuation-in-part of application No. 09/590,962, filed on Jun. 9, 2000, now abandoned, which is a continuation-in-part of application No. 09/442,582, filed on Nov. 18, 1999, now Pat. No. 6,452,199, which is a continuation-in-part of application No. 09/324,526, filed on Jun. 2, 1999, now Pat. No. 6,541,786, which is a continuation-in-part of application No. 09/268,243, filed on Mar. 15, 1999, now Pat. No. 6,064,072, which is a continuation-in-part of application No. 09/093,416, filed on Jun. 8, 1998, now Pat. No. 6,051,841, which is a continuation-in-part of application No. 08/854,507, filed on May 12, 1997, now Pat. No. 5,763,930.

(51) Int. Cl.$^7$ .................................................. H05H 1/04
(52) U.S. Cl. ......................... 250/504 R; 250/504 R; 250/504; 250/503
(58) Field of Search ...................... 250/504 R, 504, 250/503

(56) References Cited

U.S. PATENT DOCUMENTS 2,759,106 A 8/1956 Wolter ......................... 250/53
3,150,483 A 9/1964 Mayfield et al. ............. 60/35.5

(List continued on next page.)

OTHER PUBLICATIONS

Apruzese, J.P., "X–Ray Laser Research Using Z Pinches," *Am. Inst. of Phys.* 399–403, (1994).

(List continued on next page.)

*Primary Examiner*—John R. Lee
*Assistant Examiner*—Anthony Quash
(74) *Attorney, Agent, or Firm*—William Cray

(57) ABSTRACT

The present invention provides a pulse power system for extreme ultraviolet and x-ray light sources. The pulse power system produces electrical pulses of at least 12 J at pulse repetition rates of at least 2000 Hz. The system is extremely reliable and has design lifetime substantially in excess of 10 billion pulses. The system includes a charging capacitor bank, a fast charger for charging the charging capacitor bank in time periods of less than 0.5 seconds. A voltage control circuit is provided for controlling the charging voltage capacitor to within less than 0.5 percent of desired values. The system includes a magnetic compression circuit for creating, compressing in duration and amplifying voltage pulses. A trigger circuit discharges the charging capacitor bank into the pulse compression circuit so as to produce EUV or x-ray light pulses with a timing accuracy of less than 10 ns. In a preferred embodiment a pulse transformer with at least two one-turn primary windings and a single one turn secondary winding is included in the pulse compression circuit and increases the pulse voltage by at least a factor of 3.

The pulse power system described herein is useful for providing high energy electrical pulses at repetition rates in excess of 2000 Hz for several high temperature discharge EUV or x-ray light sources. These include dense plasma focus devices, Z pinch devices, hollow cathode Z-pinch devices and capillary discharge devices. Inclusion of the pulse transformer is recommended when the system is used for dense plasma focus, and the two types of Z-pinch devices.

20 Claims, 6 Drawing Sheets

U.S. PATENT DOCUMENTS

| | | | |
|---|---|---|---|
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,504,964 A | 3/1985 | Cartz et al. | 378/119 |
| 4,536,884 A | 8/1985 | Weiss et al. | 378/119 |
| 4,538,291 A | 8/1985 | Iwamatsu | 378/119 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,837,794 A | 6/1989 | Riordan et al. | 378/119 |
| 5,023,897 A | 6/1991 | Neff et al. | 378/122 |
| 5,027,076 A | 6/1991 | Horsley et al. | 324/674 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,313,481 A | 5/1994 | Cook et al. | 372/37 |
| 5,411,224 A | 5/1995 | Dearman et al. | 244/53 |
| 5,448,580 A | 9/1995 | Birx et al. | 372/38 |
| 5,504,795 A | 4/1996 | McGeoch | 378/119 |
| 5,729,562 A | 3/1998 | Birx et al. | 372/38 |
| 5,866,871 A * | 2/1999 | Birx | 219/121.48 |
| 5,936,988 A | 8/1999 | Partlo et al. | 372/38 |
| 5,963,616 A | 10/1999 | Silfvast et al. | 378/122 |
| 6,031,241 A | 2/2000 | Silfvast et al. | 250/504 |
| 6,039,850 A | 3/2000 | Schulz | 204/192.15 |
| 6,172,324 B1 | 1/2001 | Birx | 219/121.57 |

OTHER PUBLICATIONS

Bollanti, et al., "Compact Three Electrodes Excimer Laser IANUS for a POPA Optical System," *SPIE Proc.* (2206)144–153, (1994).

Choi, et al., "A $10^{13}$ A/s High Energy Density Micro Discharge Radiation Source," *B. Radiation Characteristics*, p. 287–290.

Choi, et al., "Fast pulsed hollow cathode capillary discharge device," *Rev. of Sci. Istrum.* 69(9):3118–3122 (1998).

Fomenkov, et al., "Characterization of a 13.5nm Source for EUV Lithography based on a Dense Plasma Focus and Lithium Emission," Sematech Intl. Workshop on EUV Lithography (Oct. 1999).

Hansson, et al., "Xenon liquid jet laser–plasma source for EUV lithography," Emerging Lithographic Technologies IV, *Proc. Of SPIE*, vol. 3997:729–732 (2000).

Kato, Yasuo, "Electrode Lifetimes in a Plasma Focus Soft X–Ray Source," *J. Appl. Phys.* (33) Pt. 1, No. 8:4742–4744 (1991).

Kato, et al., "Plasma focus x–ray source for lithography," Am. Vac. Sci. Tech. B., 6(1): 195–198 (1988).

Lebert, et al., "Soft x–ray emission of laser–produced plasmas using a low–debris cryogenic nitrogen target," *J. App. Phys.*, 84(6):3419–3421 (1998).

Lebert, et al., "A gas discharge based radiation source for EUV–lithography," Intl. Conf. Micro and Nano–Engineering 98 (Sept. 2–24, 1998) Leuven, Belgium.

Lebert, et al., "Investigation of pinch plasmas with plasma parameters promising ASE," Inst. Phys. Conf. Ser No. 125: Section 9, pp. 411–415 (1992) Schiersee, Germany.

Lee, Ja H., "Production of dense plasmas in hypocyloidal pinch apparatus," *The Phys. Of Fluids*, 20(2):313–321 (1977).

Lewis, Ciaran L.S., "Status of Collision–Pumped X–ray Lasers," *Am Inst. Phys.* pp. 9–16 (1994).

Malmqvist, et al., "Liquid–jet target for laser–plasma soft x–ray generation,"*Am. Inst. Phys.* 67(12):4150–4153 1996).

Mather, et al., "Stability of the Dense Plasma Focus," *Phys. Of Fluids,* 12(11):2343–2347 (1969).

Mayo, et al., "A magnetized coaxial source facility for the generation of energetic plasma flows," *Sci. Technol.* vol. 4:pp. 47–55 (1994).

Mayo, et al., "Initial Results on high enthalpy plasma generation in a magnetized coaxial source," *Fusion Tech* vol. 26:1221–1225 (1994).

Nilsen, et al., "Analysis of resonantly photopumped Na–Ne x–ray–laser scheme," *Am Phys. Soc.* 44(7):4591–4597 (1991).

Partlo, et al., "EUV (13.5nm) Light Generation Using a Dense Plasma Focus Device," *SPIE Proc. On Emerging Lithographic Technologies III*, vol. 3676, 846–858 (Mar. 1999).

Porter, et al., "Demonstration of Population Inversion by Resonant Photopumping in a Neon Gas Cell Irradiated by a Sodium Z Pinch," *Phys. Rev. Let.*, 68(6):796–799, (Feb. 1992).

Price, Robert H., "X–Ray Microscopy using Grazing Incidence Reflection Optics," *Am. Inst. Phys.* , pp. 189–199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253–2263 (Mar. 1993).

Scheuer, et al., "A Magnetically–Nozzled, Quasi–Steady, Multimegawatt, Coaxial Plasma Thruster," *IEEE: Transactions on Plasma Science*, 22(6) (Dec. 1994).

Schriever, et al., "Laser–produced lithium plasma as a narrow–band extended ultraviolet radiation source for photoelectron spectroscopy," *App. Optics*, 37(7):1243–1248, (Mar. 1998).

Schriever, et al., "Narrowband laser produced extreme ultraviolet sources adapted to silicon/molybdenum multilayer optics," J. of App. Phys., 83(9):4566–4571, (May 1998).

Silfvast, et al., "High–power plasma discharge source at 13.5 nm and 11.4 nm for EUV lithography," *SPIE*, vol. 3676:272–275, (Mar. 1999).

Silfvast, et al., "Lithium hydride capillary discharge creates x–ray plasma at 13.5 nanometers," *Laser Focus World,* p. 13 (Mar. 1997).

Wilhein, et al., "A slit grating spectrograph for quantitative soft x–ray spectroscopy," Am. Inst. Of Phys. Rev. of Sci. Instrum., 70(3):1694–1699, (Mar. 1999).

Wu, et al., "The vacuum Spark and Spherical Pinch X–ray/ EUV Point Sources," *SPIE, Conf. On Emerging Tech. III*, Santa Clara, CA, vol. 3676:410–420, (Mar. 1999).

Zombeck, M.V., "Astrophysical Observations with High Resolution X–ray Telescope," *Am. Inst. Of Phys.,* pp. 200–209, (1981).

\* cited by examiner

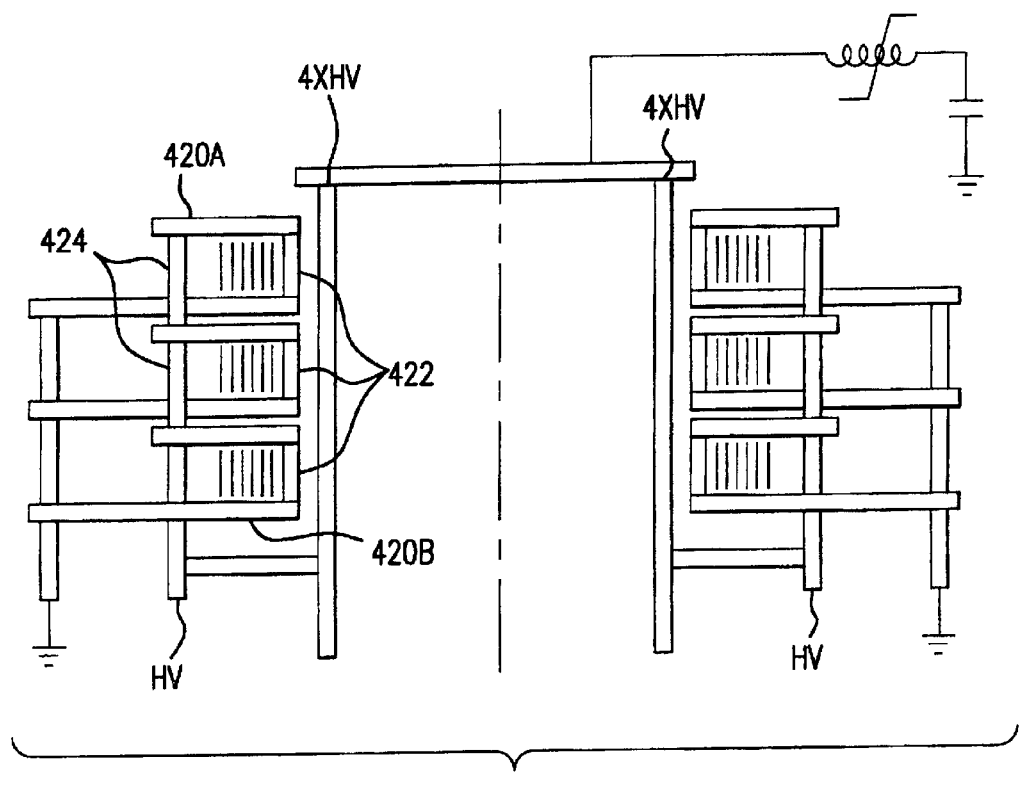
FIG.1A
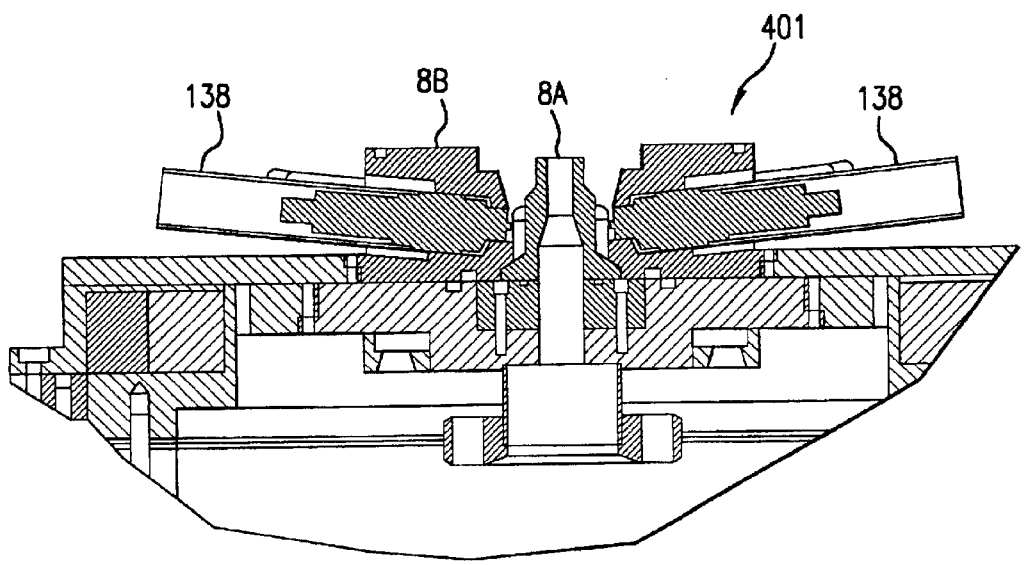
FIG.2B2

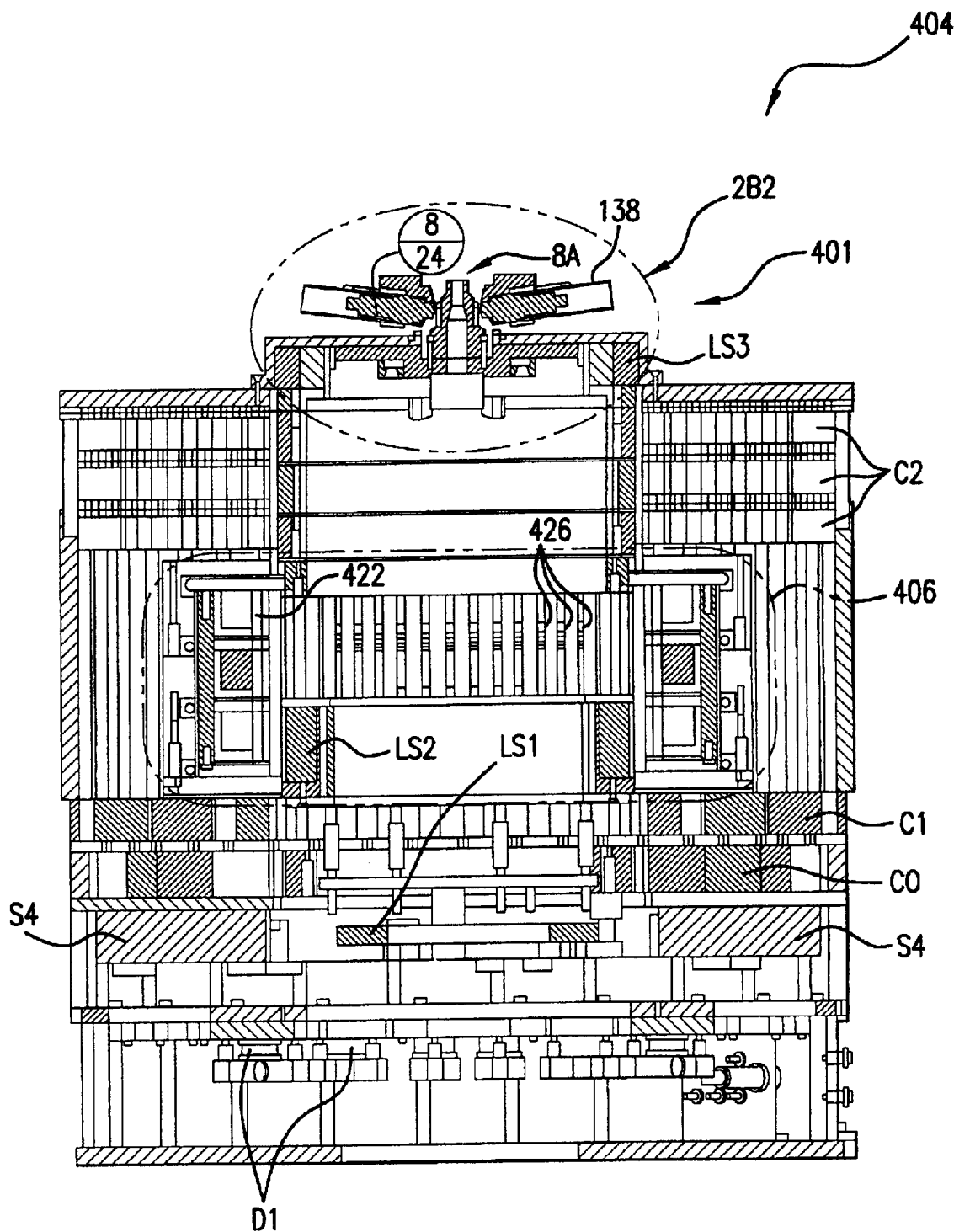
FIG.2B1

PULSE POWER SYSTEM FOR EXTREME ULTRAVIOLET AND X-RAY SOURCES

This application is a continuation-in-part of U.S. Ser. No. 09/690,084 filed Oct. 16, 2000 now U.S. Pat. No. 6,566,667, "Plasma Focus Light Source with Improved Pulse Power System," U.S. Ser. No. 09/590,962, filed Jun. 9, 2000 now abandoned, U.S. Ser. No. 09/442,582, filed Nov. 18, 1999 and U.S. Ser. No. 09/324,526, filed Jun. 2, 1999 now U.S. Pat. No. 6,541,786 which was a continuation-in-part of U.S. Ser. No. 09/268,243 filed Mar. 15, 1999 now U.S. Pat. No. 6,064,072, U.S. Ser. No. 09/093,416 filed Jun. 8, 1998 now U.S. Pat. No. 6,051,841 which is a CIP of Ser. No. 08/854,507 filed May 12, 1997 now U.S. Pat. No. 5,763,930, all of which are incorporated by reference herein. This invention relates to high-energy photon sources and in particular to highly reliable, high repetition rate x-ray and high-energy ultraviolet sources.

BACKGROUND OF THE INVENTION

The semiconductor industry continues to develop lithographic technologies which can print ever smaller integrated circuit dimensions. These systems must have high reliability, cost effective throughput, and reasonable process latitude. The integrated circuit fabrication industry has recently changed over from mercury G-line (436 nm) and I-line (365 nm) exposure sources to 248 nm and 193 nm excimer laser sources. This transition was precipitated by the need for higher lithographic resolution with minimum loss in depth-of-focus.

The demands of the integrated circuit industry will soon exceed the resolution capabilities of 193 nm exposure sources, thus creating a need for a reliable exposure source at a wavelength significantly shorter than 193 nm. An excimer line exists at 157 nm, but optical materials with sufficient transmission at this wavelength and sufficiently high optical quality are difficult to obtain. Therefore, all-reflective imaging systems may be required. An all reflective optical system requires a smaller numerical aperture than the transmissive systems. The loss in resolution caused by the smaller NA can only be made up by reducing the wavelength by a large factor. Mirrors are available which provide good reflectivity in the wavelength range between about 13.2 and 14 nm. A reliable long-life light source in this range is desired.

The present state of the art in high energy ultraviolet and x-ray sources utilizes plasmas produced by bombarding various target materials with laser beams, electrons or other particles. Solid targets have been used, but the debris created by ablation of the solid target has detrimental effects on various components of a system intended for production line operation. A proposed solution to the debris problem is to use a frozen liquid or frozen gas target so that the debris will not plate out onto the optical equipment. However, none of these systems have proven to be practical for production line operation.

It has been well known for many years that x-rays and high energy ultraviolet radiation could be produced in a plasma pinch operation. In a plasma pinch an electric current is passed through a plasma in one of several possible configuration such that the magnetic field created by the flowing electric current accelerates the electrons and ions in the plasma into a tiny volume with sufficient energy to cause substantial stripping of outer electrons from the ions and a consequent production of x-rays and high energy ultraviolet radiation. Various prior art techniques for generation of high energy radiation from focusing or pinching plasmas are described in the following papers and patents:

- J. M. Dawson, "X-Ray Generator," U.S. Pat. No. 3,961,197, Jun. 1, 1976.
- T. G. Roberts, et. al., "Intense, Energetic Electron Beam Assisted X-Ray Generator," U.S. Pat. No. 3,969,628, Jul. 13, 1976.
- J. H. Lee, "Hypocycloidal Pinch Device," U.S. Pat. No. 4,042,848, Aug. 16, 1977.
- L. Cartz, et. al., "Laser Beam Plasma Pinch X-Ray System," U.S. Pat. No. 4,504,964, Mar. 12, 1985.
- A. Weiss, et. al., "Plasma Pinch X-Ray Apparatus," U.S. Pat. No. 4,536,884, Aug. 20, 1985.
- S. Iwamatsu, "X-Ray Source," U.S. Pat. No. 4,538,291, Aug. 27, 1985.
- G. Herziger and W. Neff, "Apparatus for Generating a Source of Plasma with High Radiation Intensity in the X-ray Region, "U.S. Pat. No. 4,596,030, Jun. 17, 1986.
- A. Weiss, et. al, "X-Ray Lithography System," U.S. Pat. No. 4,618,971, Oct. 21, 1986.
- A. Weiss, et. al., "Plasma Pinch X-ray Method," U.S. Pat. No. 4,633,492, Dec. 30, 1986.
- I. Okada, Y. Saitoh, "X-Ray Source and X-Ray Lithography Method," U.S. Pat. No. 4,635,282, Jan. 6, 1987.
- R. P. Gupta, et. al., "Multiple Vacuum Arc Derived Plasma Pinch X-Ray Source," U.S. Pat. No. 4,751,723, Jun. 14, 1988.
- R. P. Gupta, et. al., "Gas Discharge Derived Annular Plasma Pinch X-Ray Source," U.S. Pat. No. 4,752,946, Jun. 21, 1988.
- J. C. Riordan, J. S. Peariman, "Filter Apparatus for use with an X-Ray Source," U.S. Pat. No. 4,837,794, Jun. 6, 1989.
- W. Neff, et al., "Device for Generating X-radiation with a Plasma Source", U.S. Pat. No. 5,023,897, Jun. 11, 1991.
- D. A. Hammer, D. H. Kalantar, "Method and Apparatus for Microlithography Using X-Pinch X-Ray Source," U.S. Pat. No. 5,102,776, Apr. 7, 1992.
- M. W. McGeoch, "Plasma X-Ray Source," U.S. Pat. No. 5,504,795, Apr. 2, 1996.
- G. Schriever, et al., "Laser-produced Lithium Plasma as a Narrow-band Extended Ultraviolet Radiation Source for Photoelectron Spectroscopy", *Applied Optics*, Vol. 37, No. 7, pp. 1243–1248, March 1998.
- R. Lebert, et al., "A Gas Discharged Based Radiation Source for EUV Lithography", *Int. Conf. On Micro and Nano Engineering*, September, 1998.
- W. T. Silfast, et al., "High-power Plasma Discharge Source at 13.5 nm and 11.4 nm for EUV Lithography", *SPIE Proc. On Emerging Lithographic Technologies III*, Vol. 3676, pp. 272–275, March 1999.
- F. Wu, et al., "The Vacuum Spark and Spherical Pinch X-ray/EUV Point Sources", *SPIE Proc. On Emerging Lithographic Technologies III*, Vol. 3676, pp. 410–420, March 1999.
- I. Fomenkov, W. Partlo, D. Birx, "Characterization of a 13.5 nm for EUV Lithography based on a Dense Plasma Focus and Lithium Emission", *Sematech International Workshop on EUV Lithography*, October, 1999.

Typical prior art plasma focus devices can generate large amounts of radiation suitable for proximity x-ray lithography, but are limited in repetition rate and reliability due to large per pulse electrical energy requirements and short lived internal components. The stored electrical energy requirements for these systems range from 1 kJ to 100 kJ. The repetition rates were typically between a few pulses per second to a few hundred pulses per second and these prior art devices were not suitable for production line operation.

A hollow cathode triggered pinch source which is self-triggered has been described in the literature. However, a disadvantage of this approach is that the output radiation cannot be varied over a significant amplitude range. Adjustment of the output radiation is typically required in laser based lithography sources in order to produce a consistent dose exposure on the wafers and compensate for burst transients associated with the optics in the stepper/scanner as well as energy transients in the source itself. Because the hallow cathode pinch source is self-triggered, there is no rapid means for adjusting the energy delivered to the pinch, and therefore the output radiation energy. The gas pressure inside the device determines the breakdown voltage at which the device triggers and that voltage determines the input energy from the capacitor energy store to the source. In order to vary the output radiation energy, one would have to adjust the gas pressure internal to the pinch. At the high rep-rates required for a production EUV source (for example about 4–5 KH$_3$), adjusting the gas pressure would not be feasible on a pulse-to-pulse basis in order to compensate for these normal energy variations. In addition, timing requirements are likely to exist in synchronizing the hollow cathode triggered source radiation with a radiation energy monitor in the stepper. In a self-triggered system, the variation in timing is likely to be unacceptable.

What is needed is a production line reliable system for producing high energy ultraviolet and x-radiation which operates at high repetition rates with good timing control and avoids prior art problems associated with debris formation.

SUMMARY OF THE INVENTION

The present invention provides a pulse power system for extreme ultraviolet and x-ray light sources. The pulse power system produces electrical pulses of at least 12 J at pulse repetition rates of at least 2000 Hz. The system is extremely reliable and has design lifetime substantially in excess of 10 billion pulses. The system includes a charging capacitor bank, a fast charger for charging the charging capacitor bank in time periods of less than 0.5 ms. A voltage control circuit is provided for controlling the charging voltage capacitor to within less than 0.5 percent of desired values. The system includes a magnetic compression circuit for creating, compressing in duration and amplifying voltage pulses. A trigger circuit discharges the charging capacitor bank into the pulse compression circuit so as to produce EUV or x-ray light pulses with a timing accuracy of less than 10 ns. In a preferred embodiment a pulse transformer with at least two one-turn primary windings and a single one turn secondary winding is included in the pulse compression circuit and increases the pulse voltage by at least a factor of 3.

The pulse power system described herein is useful for providing high energy electrical pulses at repetition rates in excess of 2000 Hz for several high temperature discharge EUV or x-ray light sources. These include dense plasma focus devices, Z-pinch devices, hollow cathode Z-pinch devices and capillary discharge devices. Inclusion of the pulse transformer is especially recommended when the system is used for dense plasma focus, and the two types of Z-pinch devices.

BRIEF DESCRIPTION OF THE DRAWINGS

FIG. 1A shows structure elements of a pulse transformer.

FIGS. 2B1 and 2B2 are cross-section drawings of a plasma pinch prototype EUV device.

DETAILED DESCRIPTION OF PREFERRED EMBODIMENTS

Figure 1:
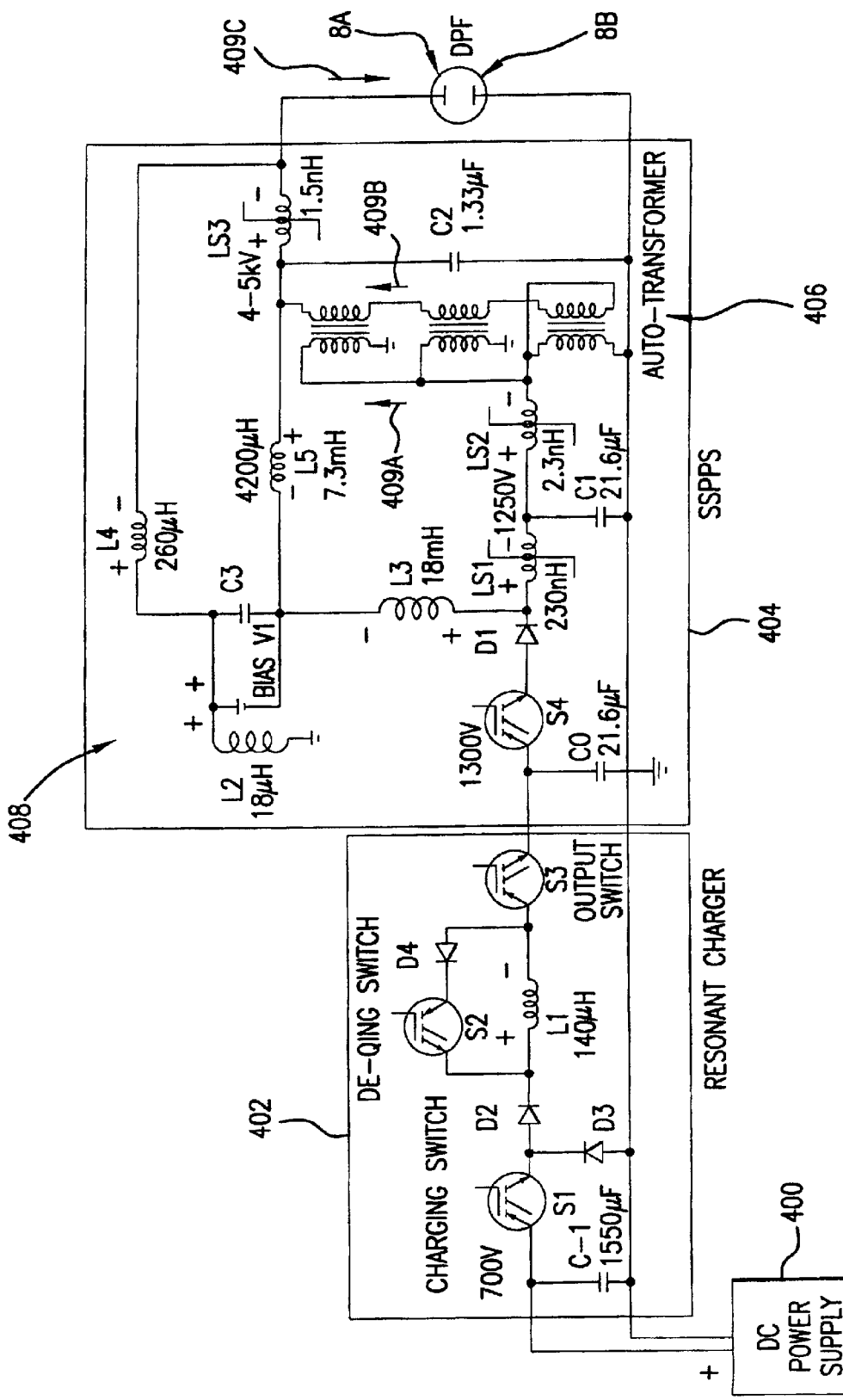
FIG. 1 is an electrical drawing of a pulse power system useful as a power source for EUV and soft x-ray sources.

To produce light in the spectral range of 13–14 nm from plasma requires a very hot plasma corresponding to temperatures of 10's of eV. Plasmas at these temperatures can be created by focusing a very high power (very short pulse) laser beam or a high energy electron beam on the surface of a metal target. It is also possible to produce a plasma in a gas with an electric discharge using any of several special discharge techniques. Some of these techniques are discussed in the papers referred to in the background section. These techniques included (1) a dense plasma focus technique (2) a regular Z-pinch technique, (3) a hollow cathode Z-pinch and (4) a capillary discharge technique. All of these techniques are discussed in greater detail below. For use as a lithography light source for integrated circuit fabrication the light source and the power supply for it should be capable of continuous, reliable, round-the-clock operation for many billions of pulses. This is because the lithography machines and the associated fabrication lines are extremely expensive and any unscheduled down time could represent losses of hundreds of thousands of dollars per hour.

Several prior art pulse power supply systems are known for supplying short electrical high voltage pulses to create the discharges in these devices. However, none of these prior art power supplies provides the reliability and control features needed for high repetition rate, high power long-life and reliability needed for integrated circuit lithographic production. Applicants have, however, built and tested a pulse power system relying in part on technology developed by Applicants for their excimer laser light sources. These excimer lasers producing 248 nm and 193 nm light, are currently extensively used as light sources for integrated circuit fabrication. This preferred embodiment built and tested by Applicants is described in the next section.

Electrical Circuit

A description of the electrical circuit diagram of this preferred pulse power system is set forth below with reference to FIG. 1 and occasionally to FIGS. 1A, 2A and B.

A conventional approximately 700 V dc power supply 400 is used to convert AC electrical power from utility 208 Volt, 3 phase power into approximately 700 to 800 V dc 50 amp power. This power supply 400 provides power for resonant charger unit 402. Power supply unit 400 charges up a large 1500 μF capacitor bank, C-1. Upon command from an external trigger signal, the resonant charger initiates a charging cycle by closing the command-charging switch, S1.

Once the switch closes, a resonant circuit is formed from the C-1 capacitor, a charging inductor L1, and a C0 capacitor bank which forms a part of solid pulse power system (SSPPS) 404. Current therefore begins to discharge from C-1 through the L1 inductor and into C0, charging up that capacitance. Because the C-1 capacitance is much, much larger than the C0 capacitance, the voltage on C0 can achieve approximately 2 times the initial voltage of that on C-1 during this resonant charging process. The charging current pulse assumes a half-sinusoidal shape and the voltage on C0 resembles a "one minus cosine" waveform.

In order to control the end voltage on C0, several actions may take place. First, the command-charging switch S1 can be opened up at any time during the normal charging cycle. In this case, current ceases to flow from C-1 but the current that has already been built up in the charging inductor continues to flow into C0 through the free-wheeling diode D3. This has the effect of stopping any further energy from C-1 from transferring to C0. Only that energy left in the charging inductor L1 (which can be substantial) continues to transfer to C0 and charge it to a higher voltage.

In addition, the de-qing switch S2 across the charging inductor can be closed, effectively short-circuiting the charging inductor and "de-qing" the resonant circuit. This essentially removes the inductor from the resonant circuit and prevents any further current in the inductor from continuing to charge up C0. Current in the inductor is then shunted away from the load and trapped in the loop made up of charging inductor L1, the de-qing switch S2, and the de-qing diode D4. Diode D4 is included in the circuit since the IGBT has a reverse anti-parallel diode included in the device that would normally conduct reverse current. As a result, diode D4 blocks this reverse current which might otherwise bypass the charging inductor during the charging cycle. Finally, a "bleed down" or shunt switch and series resistor (both not shown in this preferred embodiment) can be used to discharge energy from C0 once the charging cycle is completely finished in order to achieve very fine regulation of the voltage on C0.

The DC power supply is a 208 V, 90 A, AC input, 800 V, 50 A DC output regulated voltage power supply provided by vendors such as Universal Voltronics, Lambda/EMI, Kaiser Systems, Sorensen, etc. A second embodiment can use multiple, lower power, power supplies connected in series and/or parallel combinations in order to provide the total voltage, current, and average power requirements for the system. The C-1 capacitor in the resonant charger 402 is comprised of two 450 V DC, 3100 $\mu$F, electrolytic capacitors connected together in series. The resulting capacitance is 1550 $\mu$F rated at 900 V, providing sufficient margin over the typical 700–800 V operating range. These capacitors can be obtained from vendors such as Sprague, Mallory, Aerovox, etc. The command charging switch S1 and output series switch S3 in the embodiment are 1200 V, 300 A IGBT switches. The actual part number of the switches is CM300HA-24H from Powerex. The de-qing switch S2 is a 1700 V, 400 A IGBT switch, also from Powerex, part number CM400HA-34H. The charging inductor L1 is a custom made inductor made with 2 sets of parallel windings (20 turns each) of Litz wire made on a toroidal, 50–50% NiFe tape wound core with two ⅛" air gaps and a resulting inductance of approximately 140 $\mu$H. National Arnold provides the specific core. Other embodiments can utilize different magnetic materials for the core including Molypermaloy, Metglas™, etc. The series, de-qing, and freewheeling diodes are all 1400 V, 300 A diodes from Powerex, part number R6221430PS.

Once the resonant charger 402 charges up C0, a trigger is generated by a control unit (not shown) in the resonant charger that triggers the IGBT switches S4 to close. Although only one is shown in the schematic diagram (for clarity), S4 consists of eight parallel IGBT's which are used to discharge C0 into C1. Current from the C0 capacitors then discharges through the IGBT's and into a first magnetic switch LS1. Sufficient volt-seconds are provided in the design of this magnetic switch to allow all of the 8 parallel IGBT's to fully turn on (i.e. close) prior to substantial current building up in the discharge circuit. After closure the main current pulse is generated and used to transfer the energy from C0 into C1. The transfer time from C0 to C1 is typically on the order of 5 $\mu$s with the saturated inductance of LS1 being approximately 230 nH. As the voltage on C1 builds up to the full desired voltage, the volt-seconds on a second magnetic switch LS2 run out and that switch saturates, transferring the energy on C1 into 1:4 pulse transformer 406 which is described in more detail below. The transformer basically consists of three one turn primary "windings" connected in parallel and a single secondary "winding". The secondary conductor is tied to the high voltage terminal of the primaries with the result that the step-up ratio becomes 1:4 instead of 1:3 in an auto-transformer configuration. The secondary "winding" is then tied to C2 capacitor bank that is then charged up by the transfer of energy from C1 (through the pulse transformer). The transfer time from C1 to C2 is approximately 500 ns with the saturated inductance of LS2 being approximately 2.3 nH. As the voltage builds up on C2, the volt-second product of the third magnetic switch LS3 is achieved and it also saturates, transferring the voltage on C2 to anode 8a as shown on FIGS. 14A and 14B. The saturated inductance of LS3 is approximately 1.5 nH.

Bias circuitry shown in the FIG. 1 at 408 is also used to properly bias the three magnetic switches. Current from the bias power supply V1, passes through magnetic switch LS3. It then splits and a portion of the current passes through bias inductor L5 and back to the bias power supply V1. The remainder of the current passes through the pulse transformer secondary winding and then through magnetic switches LS2 and LS1 and bias inductor L3 back to the bias power supply V1. Bias inductor L2 provides a path back to the power supply from current through the pulse transformer primary to ground. Bias inductors L3 and L5 also provide voltage isolation during the pulse in the SSPPS since the bias power supply V1 operates close to ground potential (as opposed to the potentials generated in the SSPPS where the bias connections are made).

The C0, C1 and C2 capacitances are made up of a number of parallel, polypropylene film capacitors mounted on a printed circuit board with thick (6–10 oz.) copper plating. The printed circuit boards are wedge shaped such that 4 boards make up a cylindrical capacitor deck which feeds a cylindrical bus for both the high voltage and ground connections. In such a way, a low inductance connection is formed which is important to both the pulse compression and to the stability of the plasma pinch in the DPF itself. The total capacitance for C0 and C1 are 21.6 $\mu$F each while the total capacitance for C2 is 1.33 $\mu$F. The C0 and C1 capacitors are 0.1 $\mu$F, 1600 V capacitors obtained from vendors such as Wima in Germany or Vishay Roederstein in North Carolina. The C2 capacitance is made up of three sections of capacitors stacked in series to achieve the overall voltage rating since the voltage on the secondary of the pulse transformer is about 5 kV. The C2 capacitors are 0.01 $\mu$F, 2000 V dc components, again from Wima or Vishay Roederstein. The SSPPS switches are 1400 V, 1000 A IGBT switches. The actual part number is CM1000HA-28H from Powerex. As noted earlier, 8 parallel IGBT switches are used to discharge C0 into C1. The SSPPS series diodes are all 1400 V, 300 A diodes from Powerex, part number R6221430. Two diodes are used for each IGBT switch, resulting in a total of sixteen parallel devices.

Magnetic switch LS1 is a custom made inductor made with 16 sets of parallel windings (6 turns each) of Litz wire made on a toroidal, ferrite core. The specific core is provided by Ceramic Magnetics of New Jersey and is made of CN-20 ferrite material. The toroid is 0.5" thick with an I.D. of 5.0" and an O.D. of 8.0". Magnetic switch LS2 is a single turn, toroidal inductor. The magnetic core is tape wound on a 8.875" O.D. mandrel using 2" wide, 0.7 mil thick, 2605-S3A Metglas™ from Honeywell with 0.1 mil thick Mylar wound in between layers to an outside diameter 10.94". Magnetic switch LS3 is also a single turn, toroidal inductor. The magnetic core is tape wound on a 9.5" O.D. mandrel using 1" wide, 0.7 mil thick, 2605-S3A Metglas™ from Honeywell with 0.1 mil thick Mylar wound in between layers to an outside diameter of 10.94".

The pulse transformer is shown at 406, also shown in FIG. 1A has three transformer core. Each of the three transformer cores is tape wound on a 12.8 inch O.D. mandrel 422 using 1" wide, 0.7 mil thick, 2605-S3A Metglas™ from Honeywell with 0.1 mil thick Mylar wound in between layers to an outside diameter of 14.65". Each of the three cores 418 are ring shaped, 12.8 inch I.D. and about 14 inch O.D. having heights of 1 inch. FIG. 1A is an axial cross section sketch showing the physical arrangement of the three cores and the primary and secondary "windings". Each of the primary windings actually are formed from two circular rings 420A and 420B bolted to mandrel 422 and rod-like spacers 424. The secondary "winding" is comprised of 48 circularly spaced bolts 426. The transformer operates on a principal similar to that of a linear accelerator, as described in U.S. Pat. No. 5,142,166. A high voltage current pulse in the three primary "windings" induce a voltage rise in the secondary "winding" approximately equal to the primary voltage. The result is a voltage generated in the secondary winding (i.e., rods 426) equal to three times the primary voltage pulse. But since the low voltage side of the secondary winding is tied to the primary windings a four-fold transformation is provided in this "auto-transformer" configuration.

Bias inductors L3 and L4 are both toroidal inductors wound on a Molypermalloy magnetic core. The specific core dimensions are a height of 0.8", an I.D. of 3.094", and an O.D. of 5.218". The part number of the core is a-430026-2 from Group Arnold. Inductor L3 has 90 turns of 12 AWG wire wound on the toroid for an inductance of 7.3 mH while L4 has 140 turns of 12 AWG wire wound on it for an inductance of ~18 mH. Bias inductor L6 is merely 16 turns of 12 AWG wire wound in a 6" diameter. Bias inductor L4 is 30 turns of 12 AWG wire in a 6" diameter. Bias inductor L2 is 8 turns of 12 AWG wire in a 6" diameter.

Polarity

Figure 1B:
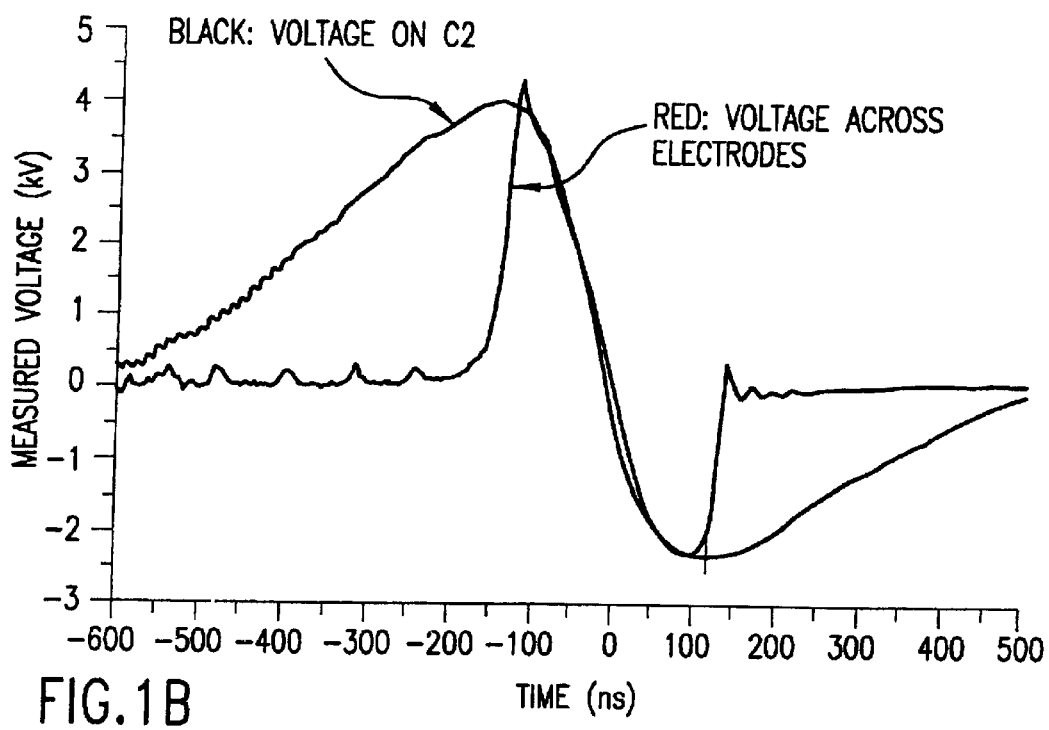
FIGS. 1B and 1C show test data.
Figure 2:
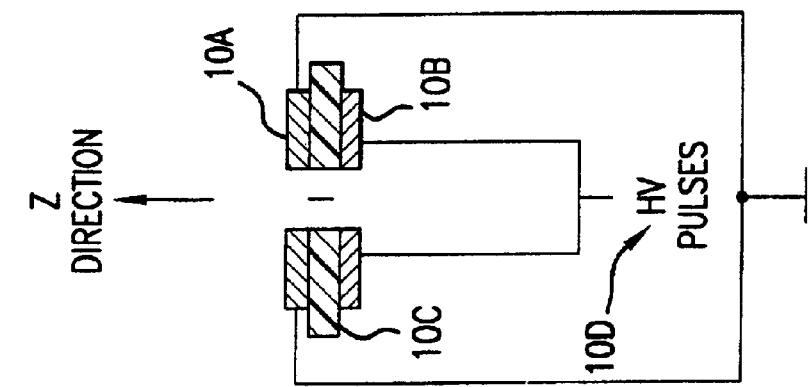
FIG. 2 shows electrical features of a dense plasma focus EUV device.

In a preferred embodiment of the present invention, the electrical circuit as shown in FIG. 1 provides positive high voltage pulses to the center electrode 8A as shown in FIG. 2, FIG. 2B1, and FIG. 2B2. The direction of current flow of each portion of each initial pulse is shown by arrows 409A, 409B and 409C respectively through the primary and secondary sides of the transformer 406 and between the electrodes. (The reader should note the direction of electron flow is opposite the direction of current flow). The reader should note also that during the latter portion of each pulse the current actually reverses as indicated by the trace shown in FIG. 1B.

Reverse Polarity

In prior art dense plasma focus devices, the central electrode is typically configured as an anode with the surrounding electrode configured as cathode. Thus, the polarity of the electrodes of the embodiment shown in FIG. 2B is consistent with this prior art technique. It is known in the prior art to reverse the polarity of the electrodes; however, the results have typically been a substantial reduction in performance. (For example, see G. Decker, et al., "Experiments Solving the Polarity Riddle of the Plasma Focus," *Physics Letters*, Vol. 89A, Number 8, 7 June 1982).

Figure 6:
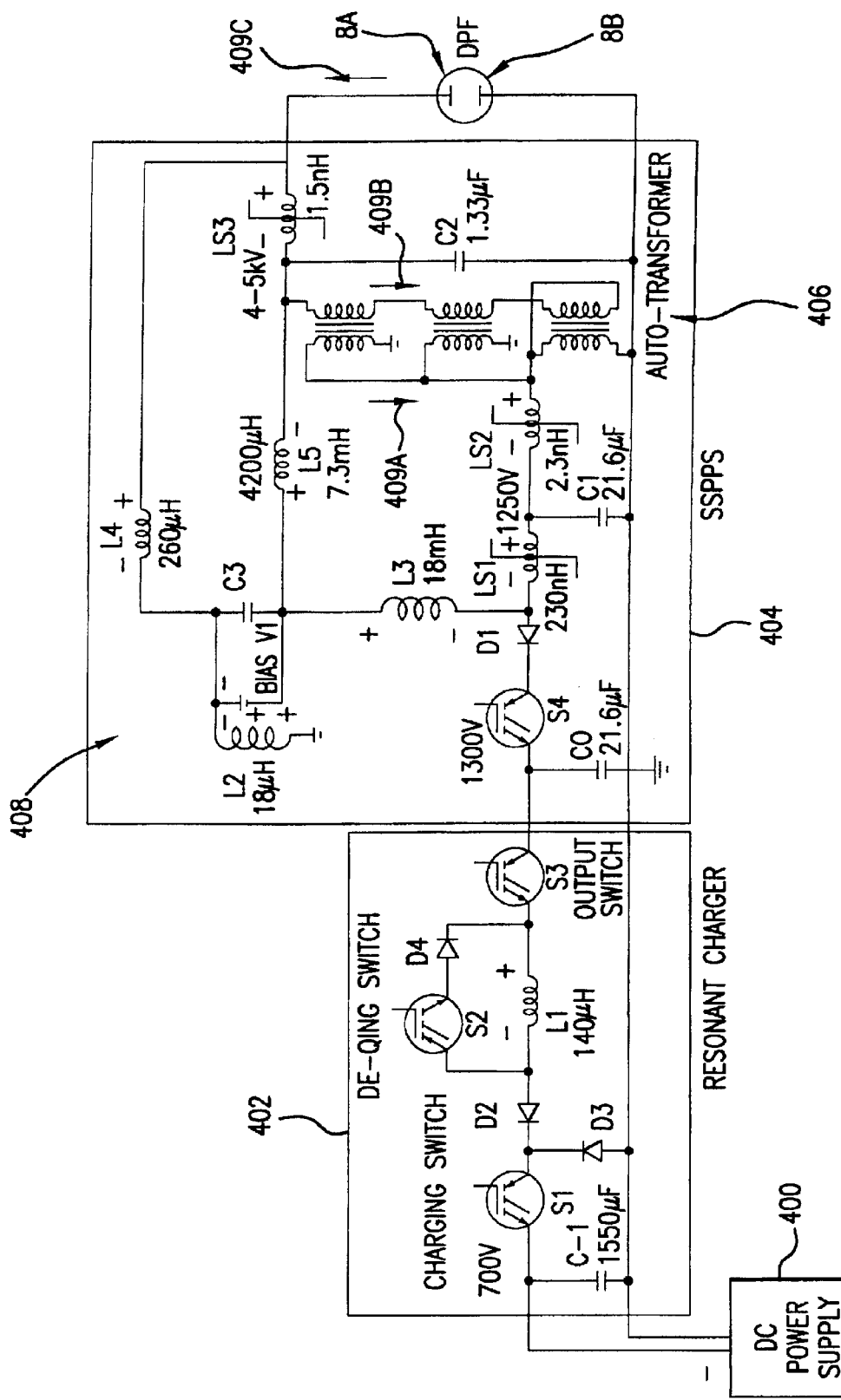
FIG. 6 is the FIG. 1 circuit converted for negative potential pulses.

Applicants have in a preferred embodiment of the present invention demonstrated excellent performance by reversing the electrode polarity of a dense plasma focus device. To do this Applicants modified the circuit shown in FIG. 1 to provide a circuit as shown in FIG. 6. The basic design of the FIG. 1 circuit made this task relatively easy. The connections on DC power supply 400 were switched, switches S1, S2, S3 and S4 were reversed and diodes D1, D2, D3 and D4 were reversed. Also the polarity of bias power supply V1 was reversed. As a result the initial current flow for each pulse was in the directions shown at 409A, 409B, and 409C in FIG. 6. Thus, the central electrode 8A as shown in the figures including FIG. 2B2 is initially charged negative and the initial current flow in this embodiment is from ground electrodes 8B to central electrode 8A. The electron flow is in the opposite direction; i.e., from central electrode 8A to surrounding electrode 8B. Another technique for reversing polarity is to modify the pulse transformer design to eliminate the "onto" aspect of the transformer. That is to connect the low voltage side to ground instead of the primary high voltage. If this is done polarity can be reversed by merely changing the secondary leads of the pulse transformer. This of course would mean in this case there would be only a factor of 3 increase in voltage rather than 4. But to compensate another primary section could be added.

Applicants' experiments have demonstrated some surprising improvements resulting from this change in polarity. An important improvement is that pre-ionization requirements are greatly reduced and may be completely eliminated. Applicants believe this improved performance results from a hollow-cathode type effect resulting from the hollow portion at the top of electrode 8A as shown in FIG. 2A. According to Applicants measurements under various conditions, the quality of pinches is better than pinches produced with the positive central electrode polarity. Applicants estimate increases in EUV output could be up to about a factor of two.

Energy Recovery

In order to improve the overall efficiency this fourth generation dense plasma focus device provides for energy recovery on a pulse-to-pulse basis of electrical pulse energy reflected from the discharge portion of the circuit. Energy recovery is achieved as explained below by reference to FIG. 1.

After the discharge C2 is driven negative. When this occurs, LS2 is already saturated for current flow from C1 to C2. Thus, instead of having energy ringing in the device (which tends to cause electrode erosion) the saturated state of LS2 causes the reverse charge on C2 to be transferred resonantly back into C1. This transfer is accomplished by the continued forward flow of current through LS2. After the transfer of charge from C2 to C1, C1 then has a negative potential as compared to C0 (which at this time is at approximately ground potential) and (as was the case with LS2) LS1 continues to be forward conducting due to the large current flow during the pulse which has just occurred. As a consequence, current flows from C0 to C1 bringing the potential of C1 up to about ground and producing a negative potential on C0.

The reader should note that this reverse energy transfers back to C0 is possible only if all the saturable inductors (LS1, LS2 and LS3) remain forward conducting until all or substantially all the energy is recovered on C0. After the waste energy is propagated back into C0, C0 is negative with respect to its initial stored charge. At this point switch S4 is opened by the pulse power control. Inverting circuit comprising inductor L1 and solid state diode D3 coupled to ground causes a reversal of the polarity of C0 as the result of resonant free wheeling (i.e., a half cycle of ringing of the L1-C0 circuit as clamped against reversal of the current in inductor L1 by diode D3 with the net result that the energy is recovered by the partial recharging of C0. Therefore, the energy which otherwise would have contributed to the erosion of the electrodes is recovered reducing the charging requirements for the following pulse.

Test Results

Figure 1C:
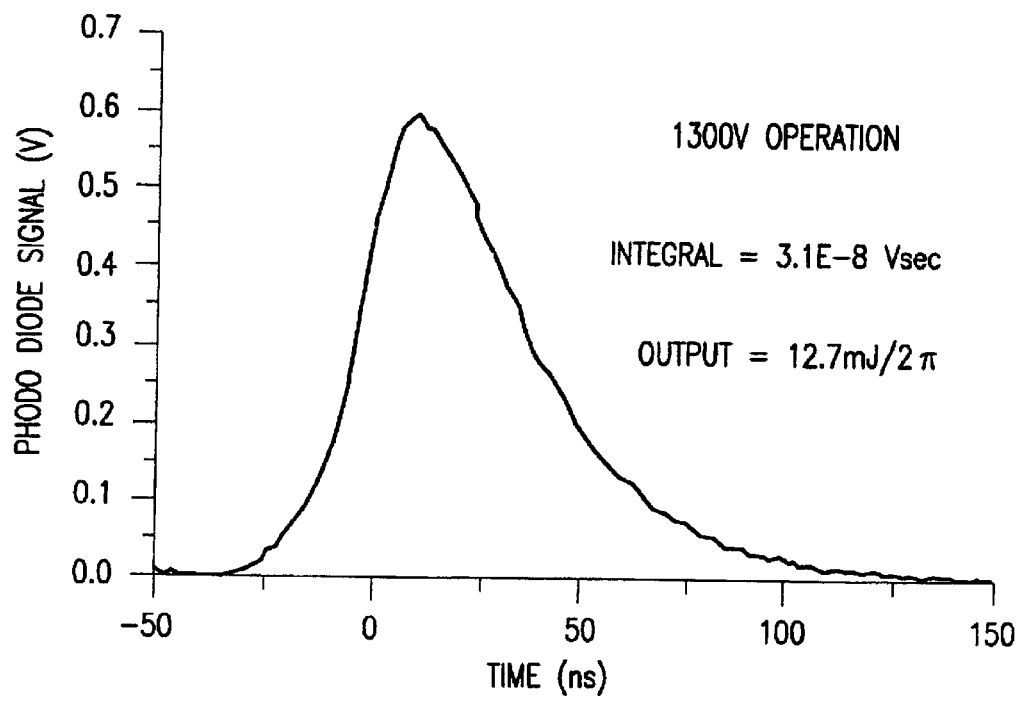

FIGS. 1B and 1C show test results from a fourth generation plasma pinch prototype device. FIG. 1B shows the pulse shape on capacitor C2 and across the electrodes and FIG. 1C shows a measured photo diode signal with Xenon as the active gas.

High Temperature Discharge EUV or X-Ray Light Sources

The high repetition rate reliable, long-life pulse power system described above can be utilized to provide high voltage electrical pulses to a variety of extreme ultraviolet or x-ray light sources. These sources included a dense plasma focus device shown in FIG. 2, conventional Z-pinch shown in FIG. 3, a hollow cathode Z-pinch device shown in FIG. 4, and a capillary discharge device as shown in FIG. 5.

In each case the light source is generally symmetrical about an axis referred to as the "Z" direction. For this reason these sources especially the first three are often referred to as "Z" pinch light sources.

Dense Plasma Focus

The principal feature of a dense plasma focus EUV light source is shown in FIG. 2. These are anode 8A, cathode 8B and insulator 8C and a high voltage pulse power source 8D. In this case when high voltage is applied a discharge starts between the cathode and the anode running along the outside surface of insulator 8C. Forces generated by the high plasma current, forces the plasma generally upward then inward creating an extremely hot plasma pinch just above the center of the anode.

The parameters specified above for the pulse power system shown in FIG. 1 were chosen especially for this light source to produce 12 J pulses of about 5,000 volts with pulse durations of about 100 to about 500 ns. Preferably a preionizer (which may be a spark gap preionizer) is provided as described in more detail in U.S. patent application Ser. No. 09/690,084 which has been incorporated by reference herein.

FIG. 2A shows a cross-section of the fourth generation plasma pinch EUV light source actually built and tested by Applicants which incorporates the pulse power system described in FIG. 1. Many of the electrical components referred to above are designated in FIG. 2A. FIG. 2B is a blow-up of the electrode region of the device showing in greater detail the anode 8A, the cathode 8B and the spark gap preionizers 138.

Conventional Z Pinch

Figure 3:
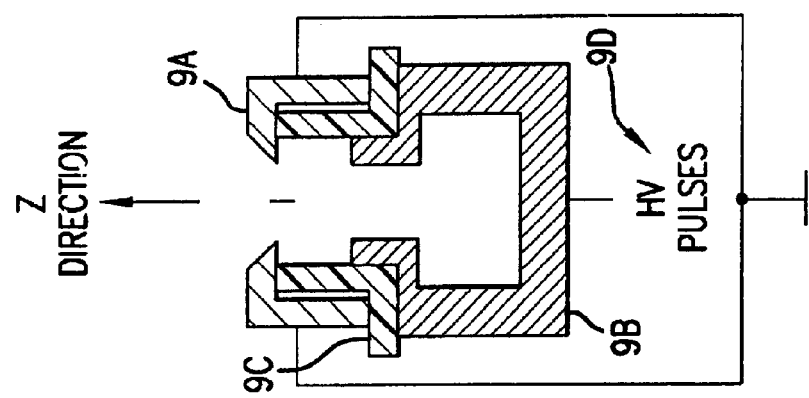
FIG. 3 shows features of a conventional Z-pinch device.

A conventional Z-pinch light source is shown in FIG. 3. In this case the discharge starts between the anode and the cathode along the inside surface of insulator 9C. The forces generated by the high-current, forces the plasma to the center of the cylindrical volume formed by insulator 9C and causes the plasma to pinch with extremely hot temperatures near the upper end of the volume.

The pulse power circuit shown in FIG. 1 with the components described above would work for embodiments of the conventional Z-pinch design, although persons skilled in the art may choose to make changes to coordinate the parameters of the pulse power electrical components with specific design parameters of the Z-pinch. For example, if 5,000 volt pulses are preferred this can be easily accomplished simply with the same basic circuit as shown in FIG. 1 but with one additional one-turn primary winding on the pulse transformer 406. With this design a preionizer is usually provided to help initiate the plasma at the start of each pulse. These preionizers may be spark gap or other preionizer source and are usually powered from a separate source not shown.

Hollow Cathode Z-Pinch

Figure 4:
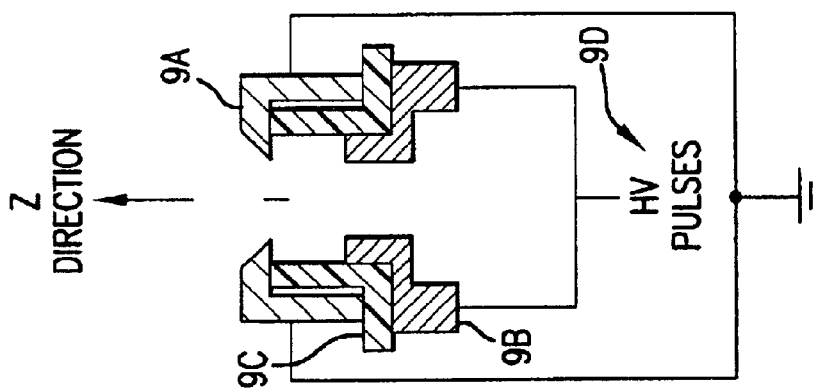
FIG. 4 shows features of a hollow cathode Z-pinch device.
Figure 5:
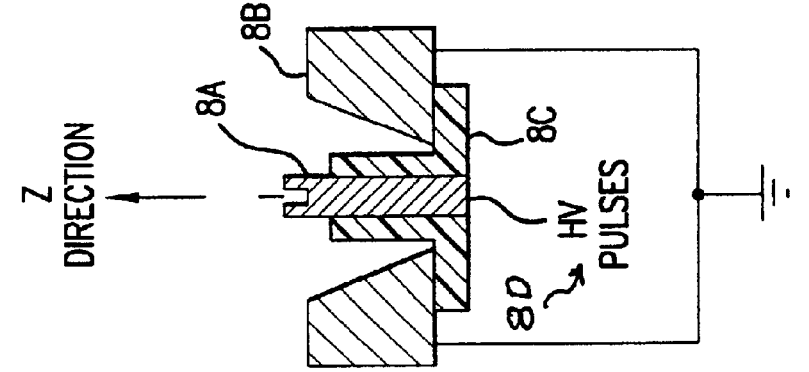
FIG. 5 shows features of a capillary discharge device.

The hollow cathode Z-pinch shown in FIG. 4 is very similar to the conventional z pinch. The difference being that the cathode is configured to produce a hollow below the cylindrically shaped insulator. This design can avoid the need for a preionizer because a very large number of ions and electrons are naturally produced near the top of the hollow region 9E at the beginning of each pulse when the high voltage increases to a sufficiently high level. For this reason this design does not require a high voltage switch to initiate the discharge. The discharge is referred to as having been self-initiated.

When using the power supply shown in FIG. 1 to provide pulse power for this design, the last saturable inductor L53 could be eliminated or its value reduced substantially since the development of plasma in the hollow in the cathode serves the same purpose as saturable inductor L53 of holding off the discharge until the peaking capacitor C2 is sufficiently charged, then permitting current to flow substantially unimpeded.

This hollow cathode Z-pinch may be designed for significantly higher pulse voltages than the first two designs. This is no problem with the power supply shown in FIG. 1. A discharge pulses of, for example, 10,000 Volts are easily provided by merely increasing the number of one-turn primary windings of the transformer 406 from 3 to 9.

Capillary Discharge

A drawing of a conventional capillary discharge EUV light source is shown in FIG. 5. In this design the compression of the plasma created by the high voltage discharge between the cathode and the anode is achieved by forcing the plasma through a narrow capillary which typically has a diameter in the range of about 0.5 mm to 4 mm. In this case the pulse duration is in the order of about 0.5 microseconds to 4 microseconds as compared to about 100 to 500 nanoseconds for the embodiment shown in FIGS. 2, 3 and 4. Also, the pulse voltages are typically substantially lower, such as about 1500 volts. However, the same pulse power system provides an excellent electrical power source with minor modifications. A simple modification is to eliminate the last step of magnetic compression which is accomplished by leaving off the C2 capacitor bank and the L53 saturable inductor. The peak pulse voltage could be reduced to 2,000 by windings in pulse transformer 406 from three to one, or the transformer could be eliminated with an increase in the initial charging voltage to provide electrical pulses of a few microseconds and a peak voltage of about 1500 volts.

It is understood that the above described embodiments are illustrative of only a few of the many possible specific embodiments which can represent applications of the principals of the present invention.

For example, many of the features disclosed in the several patents and papers cited in the Background section could be incorporated into designs using the pulse power system described. For use as a lithography light source preferred, EUV light in the range of 13.2–14 nm is preferred. Light in this range can be produced using lithium or Xenon as the active source. Buffer gases of lithium or neon are preferred.

With the use of properly chosen materials, stimulated emission is possible with these designs using the power supply of this invention. In the case of the dense plasma focus the electrode configuration could be modified to provide for a pinch long in a direction transverse to the z direction with stimulated emission in the transverse direction.

Accordingly, the reader is requested to determine the scope of the invention by the appended claims and their legal equivalents, and not by the examples which have been given.

What is claimed is:

1. A high energy high repetition rate photon source comprising:
   A. a vacuum chamber,
   B. at least two electrodes mounted within said vacuum chamber and defining an electrical discharge region and arranged to create upon electrical discharge plasmas having energies high enough to produce light at wavelengths shorter than 14 nm,
   C. a working gas comprising an active gas and a buffer gas, said buffer gas being a noble gas, and said active gas being chosen to provide light at at least one spectral line,
   D. an active gas supply system for supplying the active gas to said discharge region,
   E. a pulse power system comprising a charging capacitor and a magnetic compression circuit said magnetic compression circuit comprising a pulse transformer for providing electrical pulses at rates of at least 2000 Hz and with pulse energy and voltages high enough to create electrical discharge between said at least one pair of electrode.

2. A high energy photon source as in claim 1 wherein said electrodes are configured to produce a conventional Z-pinch.

3. A high energy photon source as in claim 1 wherein said electrodes are configured to produce a hollow cathode Z-pinch.

4. A high energy photon source as in claim 1 wherein said electrodes are configured to produce a capillary discharge.

5. The high energy photon source in claim 1 wherein one of said two electrodes is a hollow anode and said active gas is introduced into said vacuum chamber through said hollow anode.

6. The high energy photon source as in claim 1 wherein said pulse power system comprises a resonance charging system for charging said charging capacitor.

7. The high energy photon source as in claim 1 wherein said magnetic compression circuit comprising at least two saturable inductors and a bias circuit for biasing said at least two saturable inductors.

8. The high energy photon as in claim 1 and further comprising an energy recovery circuit for recovering on said charging capacitor energy reflected from said electrodes.

9. The high energy photon source as in claim 1 wherein said charging capacitor is comprised of a bank of individual capacitors.

10. The high energy photon source as in claim 1 wherein said pulse transformer is comprised of a plurality of ring shaped cores comprised of magnetic material and a primary winding in electromagnetic association with each of said cores.

11. The high energy photon source as in claim 10 wherein said magnetic material is comprised of high permeability film wrapped on a mandrel.

12. The high energy photon source as in claim 11 wherein said pulse transformer defines a secondary winding comprised of a plurality of rods.

13. A high energy photon source as in claim 1 wherein said electrodes are configured to produce a dense plasma focus.

14. The high energy photon source in claim 13 wherein said active gas comprise lithium.

15. The high energy photon source in claim 13 wherein said active gas comprise Xenon.

16. The high energy photon source as in claim 13 wherein said at least one capacitor bank comprises at least one capacitor bank optimized to provide peak capacitor current simultaneous with said plasma pinch.

17. The high energy photon source as in claim 13 wherein one of said two electrodes is a central electrode and the other electrode is a surrounding electrode.

18. The high energy photon source as in claim 17 wherein said central electrode is configured as an anode and charged with a high positive potential at the beginning of said electrical pulses.

19. The high energy photon source as in claim 18 wherein said central electrode is configured as a cathode and charged with a high negative potential at the beginning of said electrical pulses.

20. The high energy photon source as in claim 19 wherein said central electrode comprises a hollow portion producing a hollow-cathode effect at the beginning of said electrical pulses.

* * * * *